United States Patent
Tsukidate

(10) Patent No.: US 7,321,513 B2
(45) Date of Patent: Jan. 22, 2008

(54) SEMICONDUCTOR DEVICE AND METHOD OF GENERATING A REFERENCE VOLTAGE THEREFOR

(75) Inventor: Yoshihiro Tsukidate, Kawasaki (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/392,398

(22) Filed: Mar. 28, 2006

(65) Prior Publication Data

US 2007/0035993 A1 Feb. 15, 2007

Related U.S. Application Data

(63) Continuation of application No. PCT/JP2005/006266, filed on Mar. 31, 2005.

(51) Int. Cl.
*G11C 16/06* (2006.01)
(52) U.S. Cl. .............................. 365/185.2; 365/185.21; 365/185.09
(58) Field of Classification Search ............. 365/185.2, 365/185.21, 185.09
See application file for complete search history.

(56) References Cited

U.S. PATENT DOCUMENTS 4,780,854 A 10/1988 Watanabe et al.
5,608,676 A * 3/1997 Medlock et al. ....... 365/189.09

FOREIGN PATENT DOCUMENTS

| JP | 62-005422 | 1/1987 |
|----|-----------|--------|
| JP | 2001094055 | 4/2001 |
| JP | 2004110881 | 4/2004 |
| JP | 2004363887 | 12/2004 |

* cited by examiner

*Primary Examiner*—Huan Hoang
(74) *Attorney, Agent, or Firm*—Ingrassia Fisher & Lorenz, PC

(57) ABSTRACT

A semiconductor device includes at least one reference cell (6), a cascode circuit (8) that has at least two current mirror circuits (30, 33 and 30, 34) and outputs voltages dependent on a current flowing through the at least one reference cell (6) to at least two output paths (55, 56), and a switch (20) that selectively connects the at least two output paths (55, 56) to a given output terminal (27).

10 Claims, 6 Drawing Sheets

BEFORE LAPSE IN TIME

AFTER LAPSE IN TIME

SEMICONDUCTOR DEVICE AND METHOD OF GENERATING A REFERENCE VOLTAGE THEREFOR

CROSS-REFERENCES TO RELATED APPLICATIONS

This is a continuation of International Application No. PCT/JP2005/006266, filed Mar. 31, 2005 which was not published in English under PCT Article 21(2).

BACKGROUND OF THE INVENTION

1. Field of the Invention

The present invention relates to semiconductor devices and, more particularly, to a semiconductor memory device that includes a reference cell to set a reference level for reading and writing independent of memory cells, and uses the reference level during data writing and data read verify.

2. Description of the Related Art

In a semiconductor device, especially in a non-volatile memory device, reference memory cells for reference at the time of memory cell reading are provided independently of regular memory cells. For instance, a core cell, a first internal reference cell, and a second internal reference cell are provided in a core cell region that stores data. A reference voltage is generated based on outputs of the first internal reference cell and the second internal reference cell. The data read out from the core cell is compared with the reference voltage to determine whether the read data is "0" or "1".

The core cell, however, deteriorates as data is written and erased. A flash memory device stores information in accordance with the amount of charges accumulated in a charge storing layer thereof. As a result, a deterioration phenomenon is observed wherein charges fall off with time. Therefore, a reference cell is provided in the core cell region, so that the data deterioration characteristics of the core cell data match those of the reference cell data. After the data in the reference cell is erased together with the data in the core cell, the reference cell is reconfigured.

FIG. 1 shows the threshold voltage distribution of the first internal reference cell and the second internal reference cell. Since each of the first and second internal reference cells is formed with several cells, each threshold value exhibits a certain variation. As a result, a reference voltage Vref generated based on the average current of those cells also exhibits a certain variation. While the reference voltage Vref can vary with the threshold voltage due to core cell deterioration, the read margins ($\Delta$MG0, $\Delta$MG1) become smaller.

To counter this problem, Japanese Unexamined Patent Publication No. 2004-110881 discloses a technique for generating a reference voltage Vref based on the outputs of first and second internal reference cells 102 and 103, and the output of a further provided external reference cell 104 as shown in FIG. 2. Since data rewrite is not performed in the external reference cell 104, changes with age are not caused therein. Also, since the external reference cell 104 is formed with a single memory cell, the threshold value does not have a distribution width. Accordingly, the average of the outputs of the three reference cells is set as the reference voltage Vref, to narrow the threshold voltage distribution of a virtual reference cell. Thus, data can be read out with accuracy. Here, the "threshold voltage distribution of a virtual reference cell" collectively represents the voltage distributions of all the reference cells to be used for generating a reference voltage.

However, the amount of change with age varies among the reference cells, and the problem of a decrease in margin at the time of reading is still present, even with the addition of the external reference cell.

The reference voltage Vref is generated based on the output of the external reference cell that does not change charge storing characteristics with time, and the outputs of the first internal reference cell and the second internal reference cell that change charge storing characteristics with time. Due to the change with time caused by rewrites of the first internal reference cell and the second internal reference cell, the reference cell of data "0" approaches the voltage output from the external reference cell by $\Delta$V1, and the reference cell of data "1" separates from the voltage output from the external reference cell by $\Delta$V1. In that case, the distribution of a virtual reference cell deteriorates by $\Delta$V3= ($\Delta$V1+$\Delta$V2)/3.

FIG. 3 shows a case where the variation $\Delta$V2 is wider. In that case, the distribution of a virtual reference cell is not greatly affected by the voltage of the external reference cell. As a result, the distribution of the reference cell of data "0" approaches the distribution of a virtual reference cell, and the margin between them ($\Delta$MG0 in FIG. 3) vanishes.

SUMMARY OF THE INVENTION

It is therefore an object of the present invention to provide a semiconductor device and a method of generating a reference voltage in which the above disadvantages are eliminated.

A more specific object of the present invention is to provide a semiconductor device that can set an optimum reference voltage according to changes with age in the internal reference cells, and a method of generating a reference voltage.

The above objects of the present invention are achieved by a semiconductor device that includes at least one reference cell, a cascode circuit that has at least two current mirror circuits and outputs voltages dependent on a current flowing through the at least one reference cell to at least two output paths, and a switch that selectively connects the at least two output paths to a given output terminal. With this structure, the number of voltage outputs can be increased and decreased without an increase in the number of reference cells. Accordingly, the reference voltage determined from those voltages can be readily adjusted and reading can be performed without a decrease in margin at the time of data reading from the core cell.

The above objects of the present invention are also achieved by a semiconductor device that includes at least one internal reference cell that is provided in a core cell array, at least one external reference cell that is provided outside the core cell array, a first cascode circuit that has at least two current mirror circuits and outputs first voltages dependent on a current flowing through the at least one internal reference cell to at least two first output paths; a first switch that selectively connects the at least two first output paths to a given output terminal so that a selected first voltage is applied to the given output terminal, and a second cascode circuit that converts a current flowing through the at least one external reference cell into a second voltage. With this structure, the number of voltage outputs can be increased and decreased, without an increase in the number of internal and external reference cells. An internal reference cell deteriorates due to changes with age. Since the degree of deterioration varies among reference cells, voltages that are read out from the reference cells also vary. As a result, the reference voltage generated from the voltages of the reference cells is not constant. Therefore, the number of voltage outputs is increased and decreased, so as to adjust the reference voltage. Thus, reading can be performed without a decrease in margin at the time of data reading from the core cell.

In a semiconductor device in accordance with the present invention, the second cascode circuit may have at least two current mirror circuits that generate the second voltages from the current flowing through the at least one external reference cell, with the second voltages being applied to at least two second output paths. Also, the semiconductor device may further include a second switch that selectively connects the at least two second output paths to the given output terminal. Thus, the number of voltage outputs can be increased and decreased, without an increase in the number of external reference cells.

In this semiconductor device, the at least two first output paths and the at least two second output paths may be short-circuited. With this structure, a reference voltage can be generated based on the outputs of those paths.

In this semiconductor device, the at least one internal reference cell may include a first cell having a data state "0" and a second cell having a data state "1", while the at least one external reference cell has an intermediate state between data states "0" and "1". Accordingly, the data written in the core cell can be read out with high precision.

This semiconductor device may further include a sense amplifier that compares an output from the core cell array with a reference voltage that represents the average value of outputs from the given output terminal, thereby reading data stored in the core cell array. With this structure, the data read out from the core cell can be determined with precision.

This semiconductor device may further include a control circuit that controls switching of the first and second switches and changes the reference voltage so as to compensate for a change with age. Accordingly, a reference voltage in accordance with the change-with-age characteristics of reference cells can be generated.

The above objects of the present invention are also achieved by a method of generating a reference voltage that includes the steps of generating voltages from a current flowing through a reference cell, the voltages being applied to at least two output paths and selectively connecting the at least two output paths to a given terminal at which a reference voltage is available. In accordance with this method, the reference voltage determined by the voltages can be readily adjusted and reading can be performed without a decrease in margin at the time of data reading from the core cell.

In accordance with the present invention, an optimum reference voltage dependent on the change with age of the internal reference cells can be set.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF EMBODIMENTS OF THE INVENTION

The following is a description of preferred embodiments of the present invention, with reference to the accompanying drawings.

Figure 1:
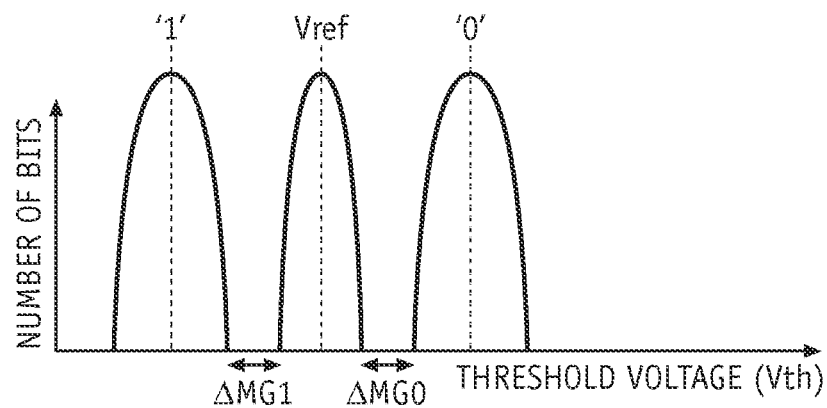
FIG. 1 shows changes in the threshold value distribution of a virtual reference cell that generates a reference voltage in a conventional non-volatile memory.
Figure 2:
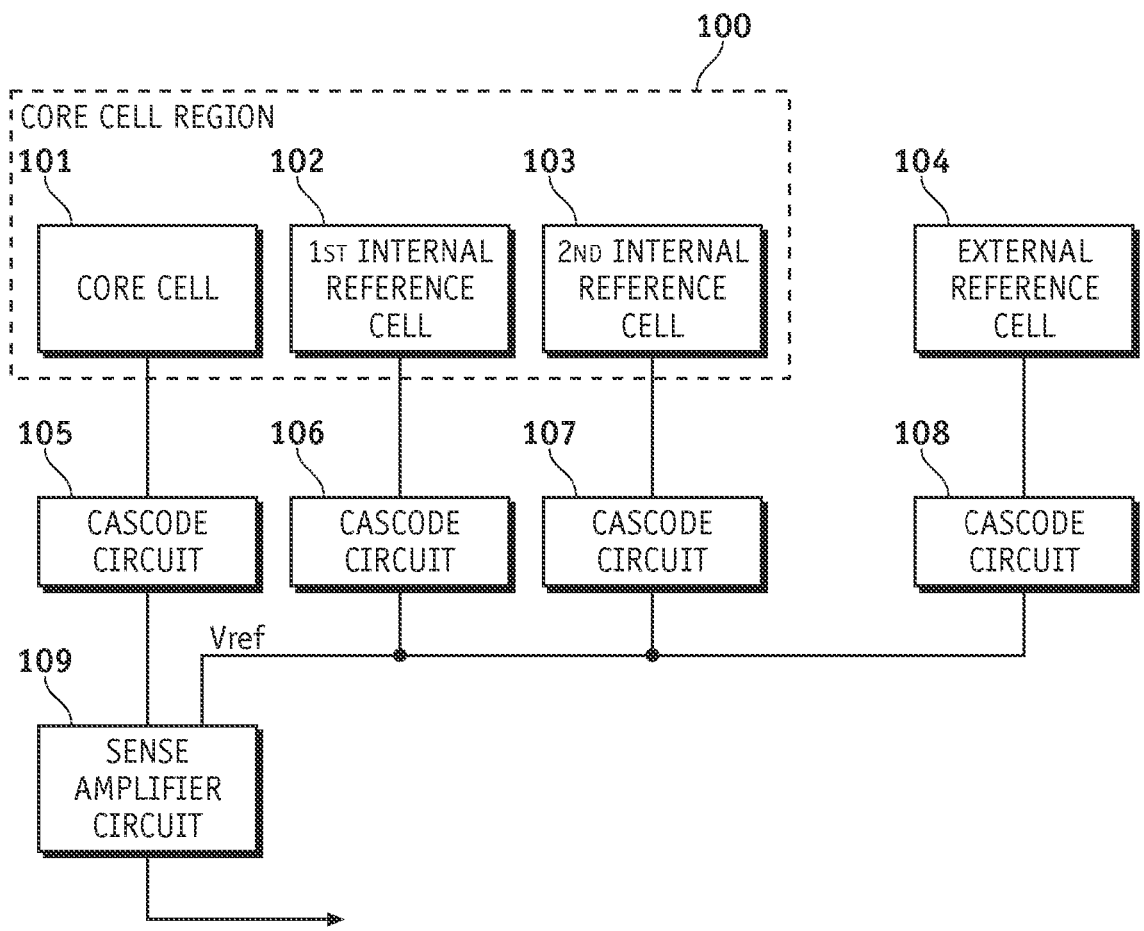
FIG. 2 illustrates the structure of a conventional non-volatile memory device.
Figure 3:
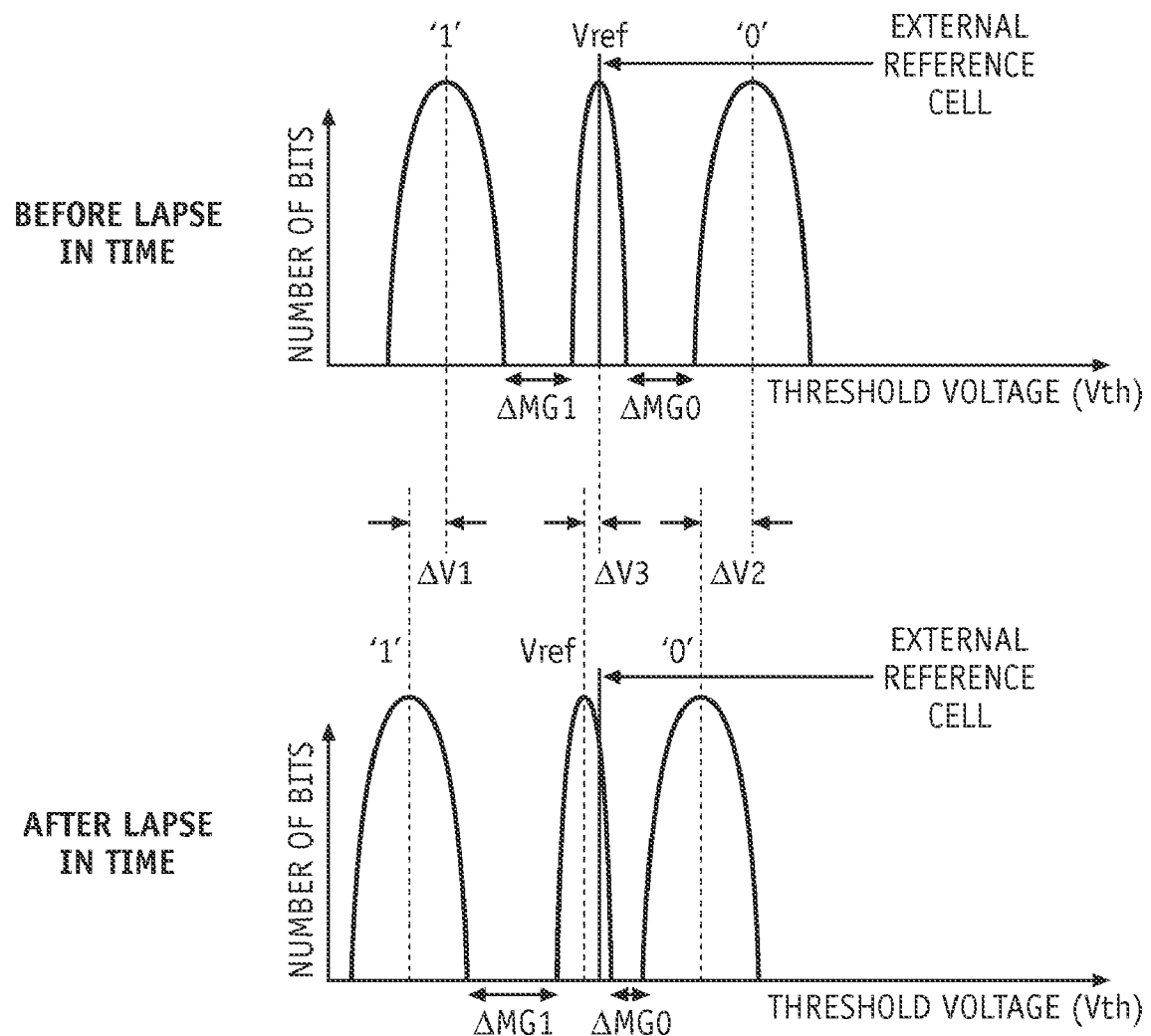
FIG. 3 shows changes in the threshold value distribution of a virtual reference cell that generates a reference voltage in a conventional non-volatile memory.
Figure 4:
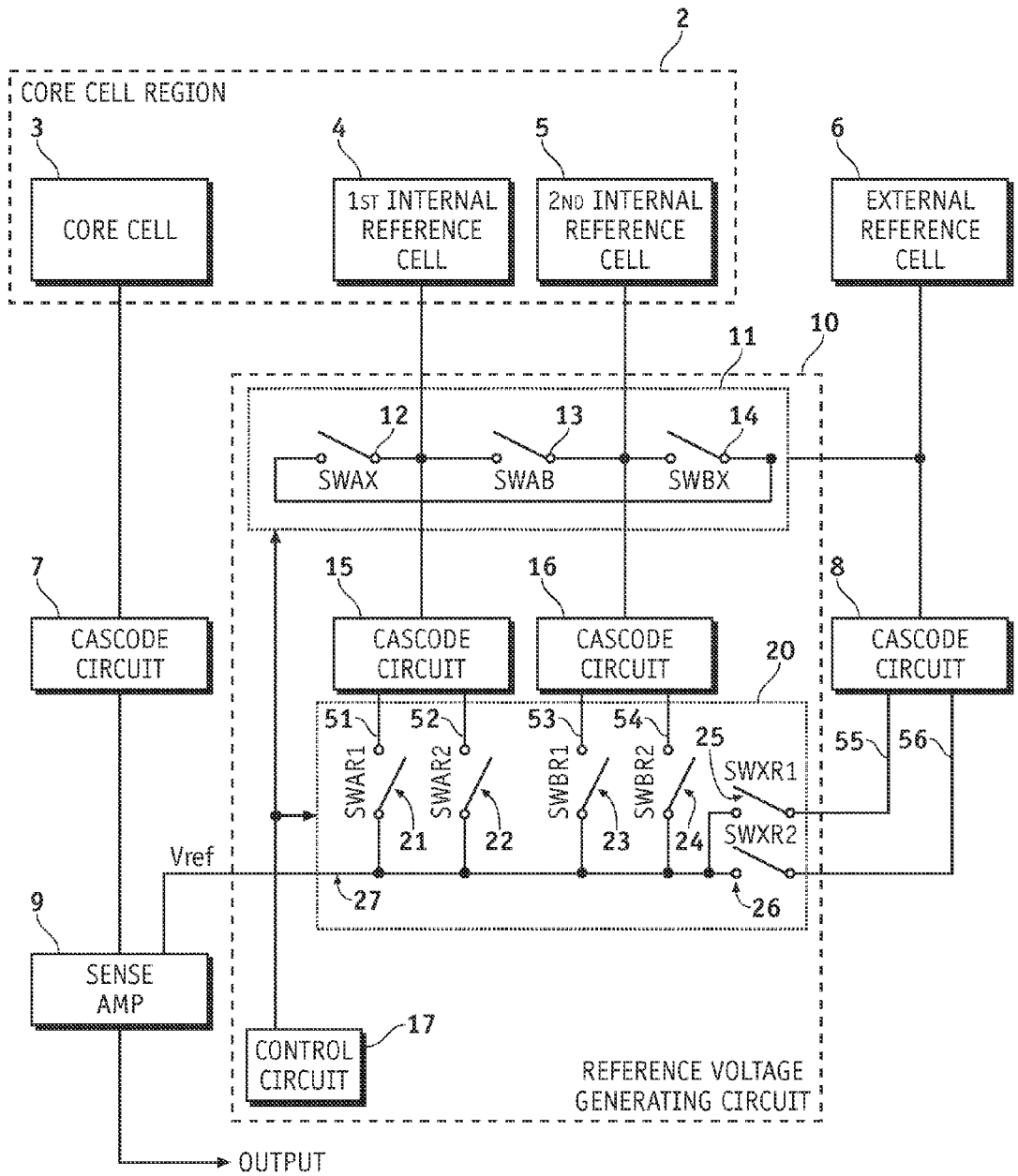
FIG. 4 illustrates the structure of a semiconductor device in accordance with the present invention.

Referring first to FIG. 4, the structure in accordance with an embodiment of the present invention is described. A semiconductor device 1 in accordance with this embodiment is a non-volatile semiconductor device that has two internal reference cell regions in a core cell array 2 and an external reference cell outside the core cell array 2. The core cell array 2 is a virtual ground memory cell array, containing memory cells, word lines, bit lines, and the like. Two-bit data is stored in each of the memory cells. A film formed by stacking an oxide film, a nitride film, and an oxide film in this order is interposed between a control gate and a substrate. Charges are trapped in the nitride film so as to change the threshold value thereof. By doing so, data "0" and data "1" are distinguished from each other. Since a trap layer such as the nitride film is an insulating film, the trapped charges are immovable. The charges are stored at both ends of the trap layer so as to record two bits in each memory cell. The memory cell in the core cell array may be a memory cell with a floating gate that is made of polycrystalline silicon as a charge storage layer. The above described structure of memory cells is an example that can be applied to semiconductor devices that read data by determining the data stored in the core cells in accordance with reference cells.

A first internal reference cell 4 has a state of data "0", for example, and a second internal reference cell 5 has a state of data "1". The external reference cell 6 has an intermediate state between the data "0" and the data "1".

This semiconductor device 1 has a reference voltage generating circuit 10, cascode circuits 7 and 8, and a sense amplifier 9. The reference voltage generating circuit 10 includes select circuits 11 and 20, cascode circuits 15 and 16, and a control circuit 17.

The switches SWAX12, SWAB 13, SWBX14 in the select circuit 11 are switched on, so as to send the outputs (currents) of the first internal reference cell 4, the second internal reference cell 5, and the external reference cell 6 to the cascode circuits 15, 16, and 8, respectively.

The cascode circuit 15 generates a voltage (a first voltage) in accordance with the current flowing through the first internal reference cell 4. Likewise, the cascode circuit 16 generates a voltage (a first voltage) in accordance with the current flowing through the second internal reference cell 5. The cascode circuit 8 generates a voltage (a second voltage) in accordance with the current flowing through the external reference cell 6.

The output voltage of the cascode circuit 15 is output to output paths 51 and 52 (first output paths). The output paths 51 and 52 have a switch SWAR1 (21) and a switch SWAR2 (22) (first switches), respectively. Switching on and off switch SWAR1 (21) and switch SWAR2 (22) is controlled by the control circuit 17 so that the output voltage of the cascode circuit 15 is output to an output terminal 27. Although each of the output paths 51 and 52 has a switch in this embodiment, only one of the two output paths may have a switch.

The output voltage of the cascode circuit 16 is similarly output to output paths 53 and 54 (first output paths). The output paths 53 and 54 have a switch SWBR1 (23) and a switch SWBR2 (24) (first switches), respectively. Switching on and off switch SWBR1 (23) and switch SWBR2 (24) is likewise controlled by the control circuit 17 so that the output voltage of the cascode circuit 16 is output to the output terminal 27. Although each of the output paths 53 and 54 has a switch in this embodiment, only one of the two output paths may have a switch.

The output voltage of the cascode circuit 8 is output to output paths 55 and 56 (second output paths). The output paths 53 and 54 have a switch SWXR1 (25) and a switch SWXR2 (26) (second switches), respectively. Switching on and off switch SWXR1 (25) and switch SWXR2 (26) is controlled by the control circuit 17 so that the output voltage of the cascode circuit 8 is output to the output terminal 27. Although each of the output paths 55 and 56 has a switch in this embodiment, only one of the two output paths may have a switch.

The outputs of the cascode circuits 15, 16, and 8 are short-circuited by switching on switches SWAR1 (21), SWAR2 (22), SWBR1 (23), SWBR2 (24), SWXR1 (25), and SWXR2 (26) in the select circuit 20 so as to output voltages to the predetermined output terminal 27. A reference voltage Vref is generated based on the average value of the voltages that are output to the output terminal 27.

The control circuit 17 includes a non-volatile memory cell for trimming, for example. Information is preset in the memory cell for trimming in accordance with memory cell degradation characteristics that are obtained at the time of product evaluation so as to control switching on and off switches SWAX 12, SWAB 13, and SWBX14 in the select circuit 11, and switches SWAR1, SWAR2, SWBR1, SWBR2, SWXR1, and SWXR2 in the select circuit 20. After shipment, this memory cell for trimming determines the switching on and off of predetermined switches. As the memory cell for trimming, it is possible to use part of the core cell.

The sense amplifier 9 compares the reference voltage Vref generated from the reference voltage generating circuit 10 with a signal that is obtained by the cascode circuit 7 current-voltage converting the data output (a current) of the core cell 3 (or a data voltage that is read from a memory cell in the core cell 3 (or a voltage that is determined by the threshold value of the memory cell to read data)). The comparison determines whether the data output read from the core cell 3 is "0" or "1".

Figure 5:
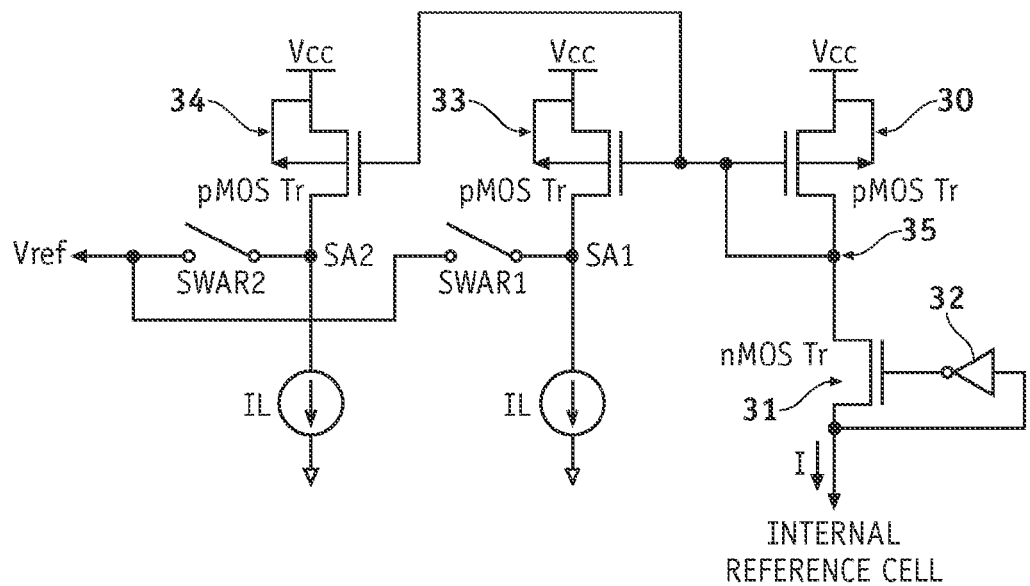
FIG. 5 illustrates the structure of a cascode circuit in accordance with the present invention.

FIG. 5 illustrates the structure of the cascode circuit 15. Since the cascode circuits 8 and 16 have the same structure as the cascode circuit 15, explanation of them is omitted herein. As shown in FIG. 5, the cascode circuit 15 has a p-channel MOS transistor 30 and an n-channel MOS transistor 31 connected in series. The first internal reference cell 4 is connected to the source side of the n-channel MOS transistor 31. Also, the gate electrode of a p-channel MOS transistor 33 and the gate electrode of a p-channel MOS transistor 34 are connected to the gate electrode of the p-channel MOS transistor 30, thereby forming a current mirror circuit.

The voltage at a node 35 that is the connecting point between the p-channel MOS transistor 30 and the n-channel MOS transistor 31 varies with the current I flowing through the internal reference cells. When the current I flowing through the internal reference cells increases, the voltage of the node 35 decreases. When the current I flowing through the internal reference cells decreases, the voltage of the node 35 increases. The current mirror circuit transmits the variation in the voltage of the node 35 to SA1 and SA2 at the drains of the p-channel MOS transistors 33 and 34. A constant current source IL is connected as a load to each of SA1 and SA2. Each constant current source IL may be a resistance made of polysilicon, for example. The switch SWAR1 to be controlled by the control circuit 17 is disposed between SA1 and the output terminal 27. The switch SWAR2 to be controlled by the control circuit 17 is disposed between SA2 and the output terminal 27. The switches SWAR1 and SWAR2 are closed to output the reference voltage Vref as the average of the outputs of the cascode circuits 15, 16, and 8 to the sense amplifier 9. Alternatively, it is possible to implement the present embodiment by forming only one of the switches SWAR1 and SWAR2.

In this embodiment, the switches SWAR1, SWAR2, SWBR1, SWBR2, SWXR1, and SWXR2 are switched on and off so that the reference voltage Vref can be generated in accordance with the characteristics of the internal reference cells. For instance, the switches SWAR1, SWAR2, SWBR1, and SWBR2, and the switch SWXR1 of the external reference cell 6 are switched on, so as to generate the reference voltage Vref, which is formed with a current twice as high as the current flowing through the first internal reference cell 4, a current twice as high as the current flowing through the second internal reference cell 5, and a current as high as the current flowing through the external reference cell 6.

Figure 6:
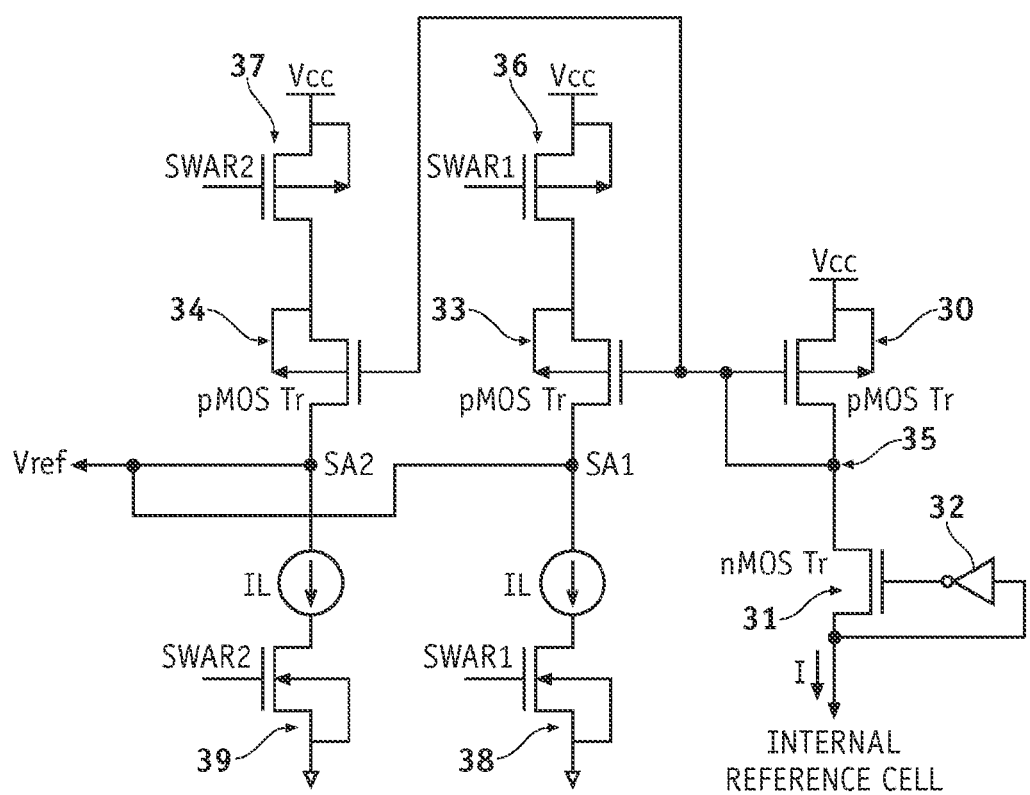
FIG. 6 illustrates the structure of another cascode circuit in accordance with the present invention.

FIG. 6 illustrates a modification of the cascode circuit 15. MOS transistors 36, 37, 38, and 39 are provided on the Vcc power source side of the p-channel MOS transistors 33 and 34, and on the Vss power source side of the constant current sources IL. The MOS transistors 36, 37, 38, and 39 can cut off the current paths running through the p-channel MOS transistors 33 and 34, and function in the same manner as the switches SWAR1 and SWAR2. In this structure, a parasitic capacitance due to switching is not caused at the node of the reference voltage Vref. Thus, the reference voltage Vref can be generated with high precision. The MOS transistors 36, 37, 38, and 39 may be provided on the side of only one of SA1 or SA2.

Figure 7A:
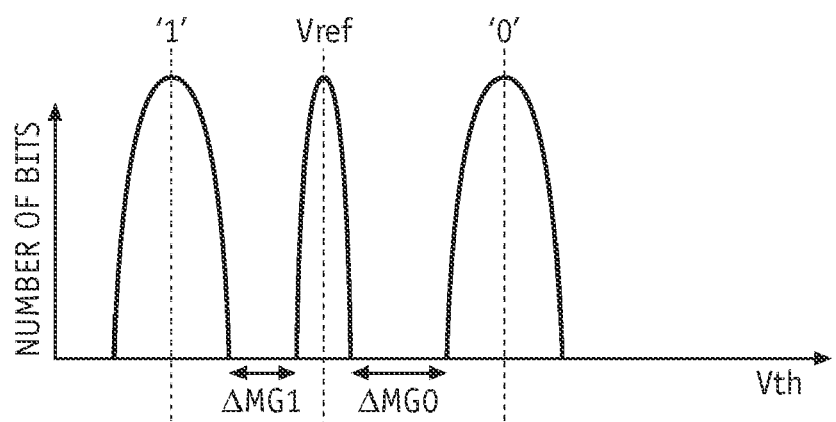
FIGS. 7A and 7B show changes in the threshold value distribution of a virtual reference cell that generates a reference voltage in a semiconductor device in accordance with the present invention.
Figure 7B:
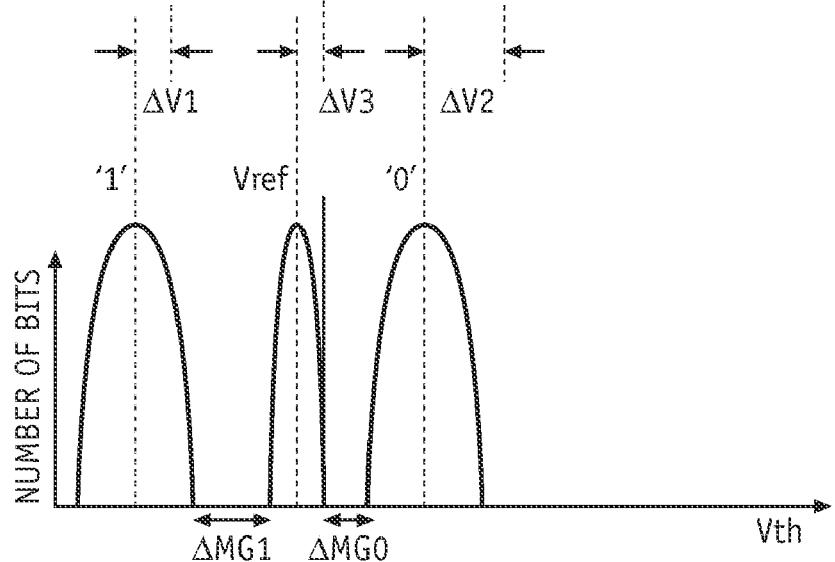

Referring now to FIGS. 7A and 7B, the function of this embodiment is described in detail. As shown in FIGS. 7A and 7B, the change with age through rewrites of the first internal reference cell 4 and the second internal reference cell 5 causes voltage output from the reference cell of the data "0" to approach the voltage output from the external reference cell 6 by ΔV2, causing voltage output from the reference cell of the data "1" to become more different from the voltage output from the external reference cell 6 by ΔV1, and also causes the distribution of a virtual reference cell to deteriorate by ΔV3.

In a case where the switches SWAR1, SWAR2, SWBR1, SWBR2, and SWXR1 shown in FIG. 4 are switched on (this situation will be hereinafter referred to as the "state A"), the distribution deterioration of the virtual reference cell becomes ΔV3=⅖ X (ΔV1+ΔV2) (see FIG. 7B). In a case where the switches SWAR1, SWBR1, and SWXR1 are switched on (this situation will be hereinafter referred to as the "state B"), the distribution deterioration of the virtual reference cell becomes $\Delta V3=\frac{1}{3} \times (\Delta V1+\Delta V2)$. In a case where the switches SWAR1, SWBR1, SWXR1, and SWXR2 are switched on (this situation will be hereinafter referred to as the "state C"), the distribution deterioration of the virtual reference cell becomes $\Delta V3=\frac{1}{4} \times (\Delta V1+\Delta V2)$. Accordingly, the reference voltage Vref can be $\frac{2}{5}$ of $(\Delta V1+\Delta V2)$ in the state A, $\frac{1}{3}$ of $(\Delta V1+\Delta V2)$ in the state B, and $\frac{1}{4}$ of $(\Delta V1+\Delta V2)$ in the state C.

In this manner, the reference voltage Vref can be readily adjusted in accordance with the degree of deterioration due to change with age of the first internal reference cell 4 and the second internal reference cell 5. Thus, the reference voltage Vref can be changed with time without an increase in the number of reference cells, and reading can be performed without a decrease in margin.

Figure 8:
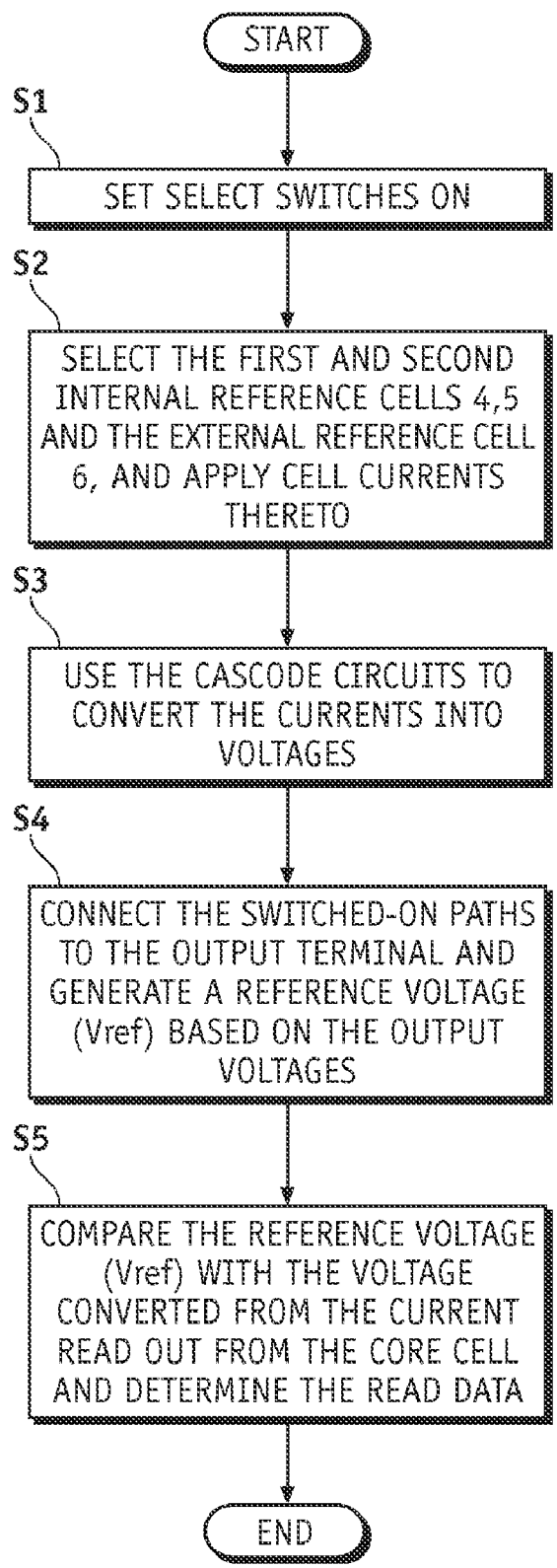
FIG. 8 is a flowchart showing operation procedures in accordance with the present invention.

Referring now to the flowchart in FIG. 8, the operation of this embodiment is described. The control circuit 17 selectively switches on a switch or switches among the switches in the select circuit 20 in accordance with the memory cell deterioration characteristics obtained at the time of product evaluation (step S1).

Next, cell currents are selectively applied to the first and second internal reference cells 4 and 5 and the external reference cell 6 (step S2). These currents are then converted into voltages by the cascode circuits 15, 16, and 8, respectively (step S3). The switched-on paths are connected to the output terminal 27 shown in FIG. 4, and the reference voltage Vref is generated based on the outputs of the first and second internal reference cells 4 and 5 and the external reference cell 6 (step S4). The reference voltage Vref is compared with the value obtained by converting the current flowing through the core cell 3 into a voltage, so as to determine the data written in the core cell 3 (step S5).

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
    at least two reference cells;
    a first cascode circuit coupled to at least a first one of the at least two reference cells and comprising at least two current mirror circuits, the first cascode circuit outputting voltages dependent on a current flowing through the at least a first one of the at least two reference cells to a first set of at least two output paths;
    a second cascode circuit coupled to at least a second one of the at least two reference cells and comprising at least two current mirror circuits, the second cascode circuit outputting voltages dependent on a current flowing through the at least a second one of the at least two reference cells to a second set of at least two output paths; and
    a switch that selectively connects output paths of the first set of at least two output paths and the second set of at least two output paths to a given output terminal, thereby providing a reference voltage at the given output terminal, the reference voltage generated in response to the current flowing through the at least a first one of the at least two reference cells and the current flowing through the at least a second one of the at least two reference cells.

2. A semiconductor device comprising:
    at least one internal reference cell that is provided in a core cell array;
    at least one external reference cell that is provided outside the core cell array;
    a first cascode circuit that has at least two current mirror circuits and outputs first voltages dependent on a current flowing through the at least one internal reference cell to at least two first output paths;
    a first switch that selectively connects the at least two first output paths to a given output terminal so that a selected first reference voltage is applied to the given output terminal, the selected first reference voltage selected in response to the current flowing through the at least one internal reference cell and an age of the core cell array; and
    a second cascode circuit that converts a current flowing through the at least one external reference cell into a second voltage.

3. The semiconductor device as claimed in claim 2, wherein:
    the second cascode circuit has at least two current mirror circuits that generate the second voltage from the current flowing through the at least one external reference cell, the second voltage being applied to at least two second output paths; and
    the semiconductor device further comprising a second switch that selectively connects the at least two second output paths to the given output terminal so that a selected second reference voltage is applied to the given output terminal, the selected second reference voltage selected in response to the current flowing through the at least one internal reference cell, the second voltage and an age of the core cell array.

4. The semiconductor device as claimed in claim 3, wherein the at least two first output paths, the at least two second output paths or both the at least two first output paths and the at least two second output paths can be selectively short-circuited to select the second reference voltage.

5. The semiconductor device as claimed in claim 3, further comprising a sense amplifier that compares an output from the core cell array with the selected second reference voltage available at the given output terminal, thereby reading data stored in the core cell array.

6. The semiconductor device as claimed in claim 5, further comprising a control circuit that controls switching of the first and second switches and changes the selected second reference voltage so as to compensate for a change in the current flowing through the at least one internal reference cell in response to the age of the core cell array.

7. The semiconductor device as claimed in claim 2, wherein the at least one internal reference cell comprises a first cell having a state of data "0" and a second cell having a state of data "1", while the at least one external reference cell has an intermediate state between data "0" and "1".

8. The semiconductor device as claimed in claim 2, further comprising a sense amplifier that compares an output from the core cell array with the selected first reference voltage available at the given output terminal, thereby reading data stored in the core cell array.

9. The semiconductor device as claimed in claim 8, further comprising a control circuit that controls switching of the first switch and changes the selected first reference voltage so as to compensate for a change in the current flowing through the at least one internal reference cell in response to the age of the core cell array.

10. A method of generating a reference voltage, comprising the steps of:
generating voltages from a current flowing through a reference cell, the voltages being applied to at least two output paths; and
selectively connecting the at least two output paths to a given terminal to provide the reference voltage at the given terminal, the at least two output paths are selectively connected to the given terminal in response to an age of the reference cell.

* * * * *